(12) United States Patent
Norgia et al.

(10) Patent No.: US 12,296,500 B2
(45) Date of Patent: May 13, 2025

(54) ACTIVE PROTECTION SYSTEM AND RELATIVE OPERATING METHOD IN A PORTABLE CUTTING TOOL

(71) Applicant: REDCAP TECHNOLOGY S.R.L., Como (IT)

(72) Inventors: Michele Norgia, Como County (IT); Valentina Cappellari, Como County (IT)

(73) Assignee: REDCAP TECHNOLOGY S.R.L., Como (IT)

( * ) Notice: Subject to any disclaimer, the term of this patent is extended or adjusted under 35 U.S.C. 154(b) by 936 days.

(21) Appl. No.: 17/289,928

(22) PCT Filed: Oct. 29, 2019

(86) PCT No.: PCT/IB2019/059271
§ 371 (c)(1),
(2) Date: Apr. 29, 2021

(87) PCT Pub. No.: WO2020/089792
PCT Pub. Date: May 7, 2020

(65) Prior Publication Data
US 2022/0001569 A1    Jan. 6, 2022

(30) Foreign Application Priority Data
Oct. 30, 2018    (IT) .................. 102018000009889

(51) Int. Cl.
*H03K 17/955*    (2006.01)
*B27G 19/00*    (2006.01)
*B26B 11/00*    (2006.01)

(52) U.S. Cl.
CPC ......... *B27G 19/003* (2013.01); *H03K 17/955* (2013.01); *B26B 11/008* (2013.01)

(58) Field of Classification Search
CPC ... B27G 19/003; H03K 17/955; B26B 11/008
See application file for complete search history.

(56) References Cited

U.S. PATENT DOCUMENTS 5,942,975 A * 8/1999 Sorensen ............... B27G 19/00
                                                 318/478
2010/0180740 A1 * 7/2010 Krapf ..................... F16P 3/148
                                                 83/72

(Continued)

FOREIGN PATENT DOCUMENTS

WO    2007/060698    5/2007
WO    2012/025456    3/2012

(Continued)

OTHER PUBLICATIONS

International Search Report for PCT/IB2019/059271 mailed Feb. 4, 2020, 4 pages.

(Continued)

*Primary Examiner* — Liang Dong
(74) *Attorney, Agent, or Firm* — NIXON & VANDERHYE (57) ABSTRACT

An active protection system and method in a portable cutting tool with movable cutting members includes at least: a cutting member stop; a controller/processor triggering the stop upon the detection of a danger condition; a proximal electrode electrically coupled with a tool handle and a distal electrode electrically coupled with the cutting member, to make up an armature of a capacitor, the processing unit feeding an electric output signal into one of the electrodes and detecting an electric input signal on the other electrode. The electric output signal includes different frequencies. A detection unit detecting a complex impedance of the electric input signal at the different frequencies. The processing unit determines a danger condition and causes triggering of the stop based on a value of the magnitude of the complex (Continued)

impedance electric signal and on a phase difference of the impedance electric signal at the different frequencies.

20 Claims, 7 Drawing Sheets

(56) References Cited

U.S. PATENT DOCUMENTS

| | | | | |
|---|---|---|---|---|
| 2010/0289506 A1* | 11/2010 | Moon | ............... | H03K 17/955 |
| | | | | 324/681 |
| 2011/0039227 A1* | 2/2011 | Aeby | ............... | A61C 19/042 |
| | | | | 433/32 |
| 2013/0152752 A1* | 6/2013 | Cappellari | .............. | F16P 3/148 |
| | | | | 83/58 |
| 2017/0090599 A1* | 3/2017 | Kuboyama | ......... | H03K 17/962 |

FOREIGN PATENT DOCUMENTS

| | | |
|---|---|---|
| WO | 2012/093124 | 7/2012 |
| WO | 2017/072404 | 5/2017 |
| WO | 2019/102129 | 5/2019 |

OTHER PUBLICATIONS

Written Opinion of the ISA for PCT/IB2019/059271 mailed Feb. 4, 2020, 10 pages.

* cited by examiner

Phase plot for signal at 15kHz

Fig. 6

Phase plot for signal at 100kHz

Fig. 7

Phase plot for signal at 200kHz

ACTIVE PROTECTION SYSTEM AND RELATIVE OPERATING METHOD IN A PORTABLE CUTTING TOOL

This application is the U.S. national phase of International Application No. PCT/IB2019/059271 filed Oct. 29, 2019 which designated the U.S. and claims priority to IT patent application No. 102018000009889 filed Oct. 30, 2018, the entire contents of each of which are hereby incorporated by reference.

BACKGROUND OF THE INVENTION

Field of the Invention

The present invention relates to a system and a operating method in an active protection accident-prevention apparatus for portable cutting tools, for example chainsaws.

Description of the Related Art

The use of portable cutting machines, used in open and poorly controlled environments—as happens for example for a chainsaw—has long led to the awareness of the risks associated with their operation: this has determined the development of automatic braking systems, of various nature, apt to triggering to stop the moving cutting part in all those cases wherein a risk condition of contact between the cutting elements of the tool and parts of the human body is determined.

Current systems generally ensure passive protection, based on limiting the damage that may result from accidental contact between the person and the moving parts of the tool. However, these systems do not ensure an adequate level of safety when the contact happens with blades, chains or sharp wheels in very fast movement, capable of producing serious damage to the person. It should also be considered that, in use, kickbacks can occur on the machine, which produce sudden approaching movements of the tool toward the body of the operator.

In addition, consider that passive protections, such as shields or protective clothing, often limit the agility of movement of the operator, thereby worsening safety issues.

Mechanical solutions have also been proposed that allow to trigger a locking or braking system of the moving cutting parts, when the operator loses the firmly grip of the tool. However, such measures do not provide sufficient guarantees for the operator safety when he enters the area of action of the cutting parts.

Recently, active protection systems have been developed, which allow the automatic interruption of the operation of the cutting member when, by means of sensors and measurement system, an excessive proximity of the operator to the cutting part of the tool is detected.

For example, WO2012/025456 in the name of the same Applicant, shows an active protection system wherein an electronic sensor, such as a proximity sensor, arranged on the cutting tool, allows the detection of an approaching of the operator to the cutting member and its immediate stopping. Such device relies on the variations in electrical capacity detected by the sensor between the operator and the blade, according to the principle which provides for the capacity increase when the distance between two electrodes decreases. The capacity sensor determines a threshold value according to the distance between the operator and the cutting element, after which a mechanical safety lock is activated.

Also WO2007/060698 in the name of the same Applicant, refers to another similar system. In this case, radio frequency signals are output from a transmitter to a receiver and a protective mesh worn by the user acting as a signal transmitter or receiver is required. The risk condition, i.e. the proximity of the cutting blade to the operator, is determined when certain predetermined thresholds of the amplitude or power of the measured signal are exceeded.

These types of active protection systems have proven to be effective in the real danger situations to which operators are subjected. However, it was found that there is room for improvement. The Applicant has in fact found that a simple reading of the magnitude of a radiofrequency signal or of the capacity with the proximity sensor, can provide false positives, i.e. warning signals even when there is no real danger for the operator. In particular, active protection systems that are based on a simple detection of the magnitude of the sensor capacity, are not able to accurately distinguish the approaching of the cutting parts to a human body compared to the approaching of the same cutting parts to a tree planted in the ground or other objects: the reason lies in the fact that the analysis performed on the detected capacity does not always allow to distinguish the capacitive reading of the object from that of the human body, when the two are strongly electrically coupled.

Through an experimental test campaign, it was verified that the capacity value measured between the cutting blade and the operator assumes the same value when the blade is about 1 cm from the human body and when the blade touches a large tree planted on the ground. This experimental evidence accounts for the fact that it is not always possible to distinguish the human body from an external object.

Figure 1:
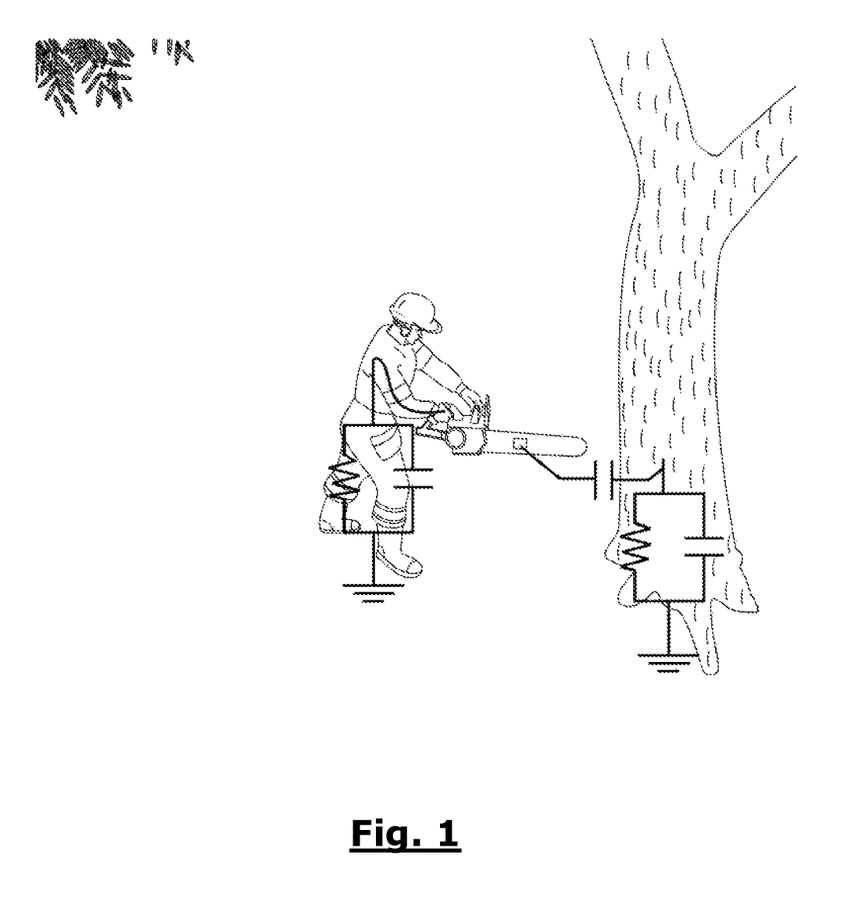
FIG. 1, as already mentioned, shows a simplified equivalent circuit during the approaching of the cutting member to a tree.

With reference to an equivalent circuit diagram as shown in FIG. 1, which represents a typical working condition of a chainsaw, it can be understood that the information related to the distance between the cutting blade and the human body or the tree to be cut is perfectly obtainable from the capacitive measurement of the sensor. Conversely, the discrimination between proximity of the blade either to the operator or to the object to be cut is a different problem, unresolved in the prior art.

SUMMARY OF THE INVENTION

The object of the present invention is therefore to propose an active protection system and method in portable cutting tools, which solves the aforementioned problems. In particular, it is desired to supply an operating system and method of a safety stop mechanism, being able to reliably distinguish the approaching of the cutting tool to a human body compared to the approaching of the same tool to a tree or other object in contact with the ground.

A solution according to the invention is achieved by means of a system and a method for detecting, assessing and operating a safety stop mechanism having the features disclosed and claimed, as are other preferred features.

BRIEF DESCRIPTION OF THE DRAWINGS

Further features and advantages of the system and the operating method according to the present invention will anyhow become more evident from the following detailed description of some preferred embodiments of the same, given by mere way of non-limiting example and illustrated in the accompanying drawings, wherein.

DETAILED DESCRIPTION OF PREFERRED EMBODIMENTS

An active protection system for a portable cutting tool comprises, in a per se known manner, a detection apparatus arranged on the cutting tool, capable of recognizing the approaching of parts of human body within a given safety distance from the cutting device of the tool, and a mechanical stopping or braking device, controlled by the detection apparatus, apt to stop the movable part of the cutting member in due time.

The detection apparatus is typically equipped with a transducer or proximity sensor measuring an impedance, placed on the cutting member (for example on the fixed blade of a chainsaw on which the cutting chain slides), with an electric signal generator apt to feed an electrical signal into the system, for example on the handle of the tool, and with a processing unit adapted to process the sampled signal through the proximity sensor.

Returning to the FIG. 1, it can be seen that the equivalent circuit of the body of the operator and of a tree to be cut can be represented, simplifying, as a single parallel RC network: as can also be understood from this figure, the Applicant has understood that the resistive parameter is the one which can constitute an adequate indicator of the length of the path and therefore the distance to which the measured capacitive component belongs.

In particular, based on such observation, the Applicant has ascertained that from the complex impedance measurement (real part and imaginary part) of a electrical signal at different frequencies, for example between 1 kHz and 500 kHz, it is possible to distinguish, by means of a comparison on the different frequencies, the capacitive variation due to the approaching of the blade to an object from that due to the approaching to the human body of the operator.

By means of experimental evidence, it was found that the impedance magnitude always reflects the known capacitive behaviour, i.e. there is a significant decrease in the impedance magnitude as the blade (which brings one of the two electrodes of the system) approaches the body of the operator or other obstacle in capacitive contact with the operator (like a tree), for any frequency considered; however, at the same time, the phase of the measured impedance varies differently at different frequencies, in the case wherein the condenser armature is closing with proximity to the operator or to other objects in strong electrical coupling with the operator.

This behaviour is due precisely to the different series impedances in the two cases, as represented in FIG. 1.

Figure 5:
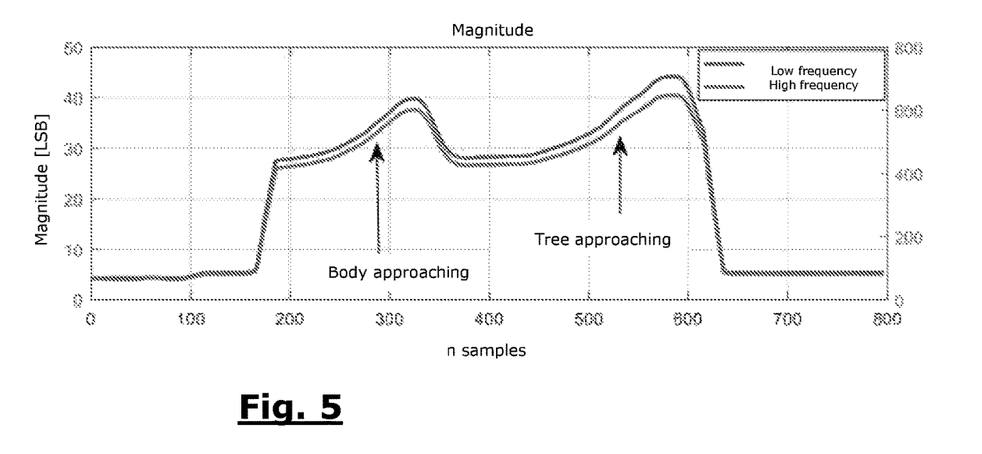
FIG. 5 is a diagram of the signal magnitude detected during an approaching path of the cutting member to the human body and then of approaching to a tree, with signal respectively at 5 kHz and at 200 kHz.

With reference to the experimental detections, in FIG. 5 the trend of the impedance magnitude at two different representative frequencies (low frequency 5 kHz and another frequency 200 kHz) is shown: as mentioned above, there are no significant magnitude differences, at various frequencies, upon approaching the blade of a chainsaw to the body of the operator or to a tree; at all frequencies the impedance magnitude decrease indicates that an approaching is occurring.

Figure 6:
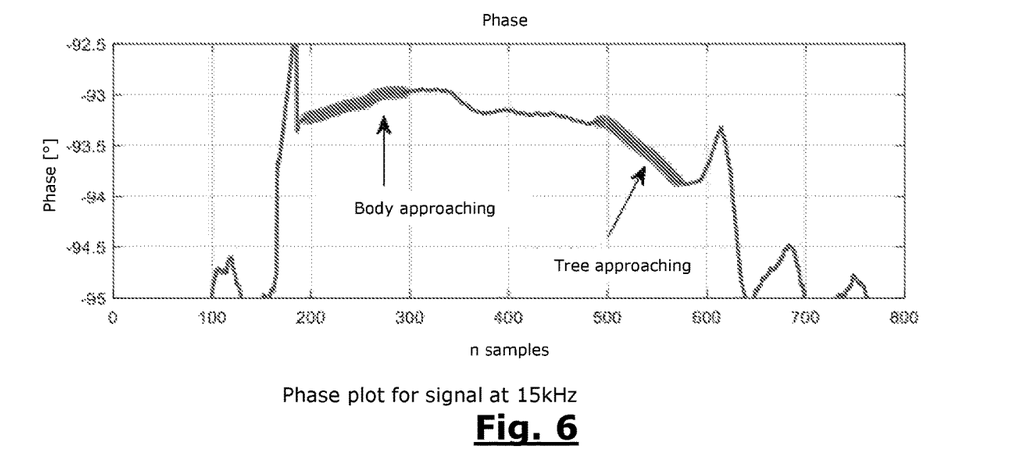
FIGS. 6, 7 and 8 are diagrams of the signal phase detected during an approaching path as in FIG. 5, with signal respectively at 15 kHz, 100 kHz and 200 kHz.
Figure 7:
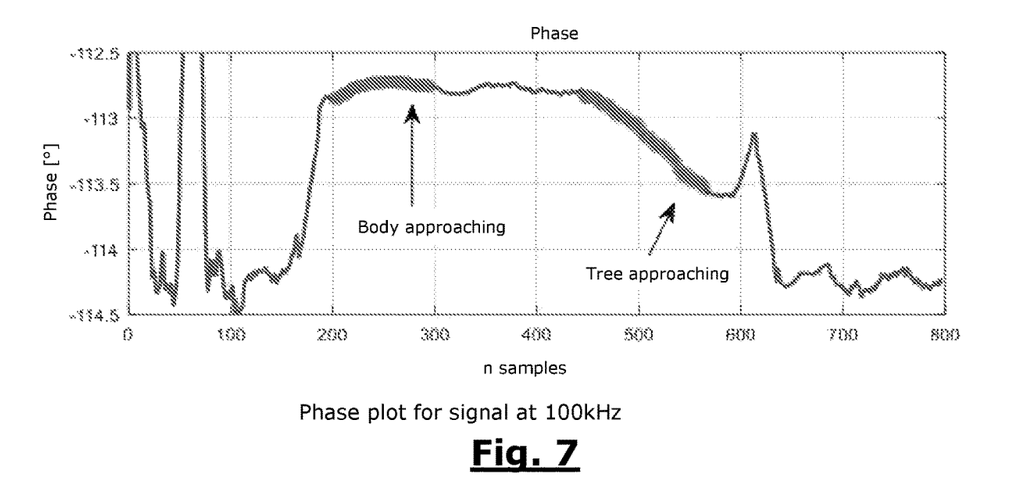
Figure 8:
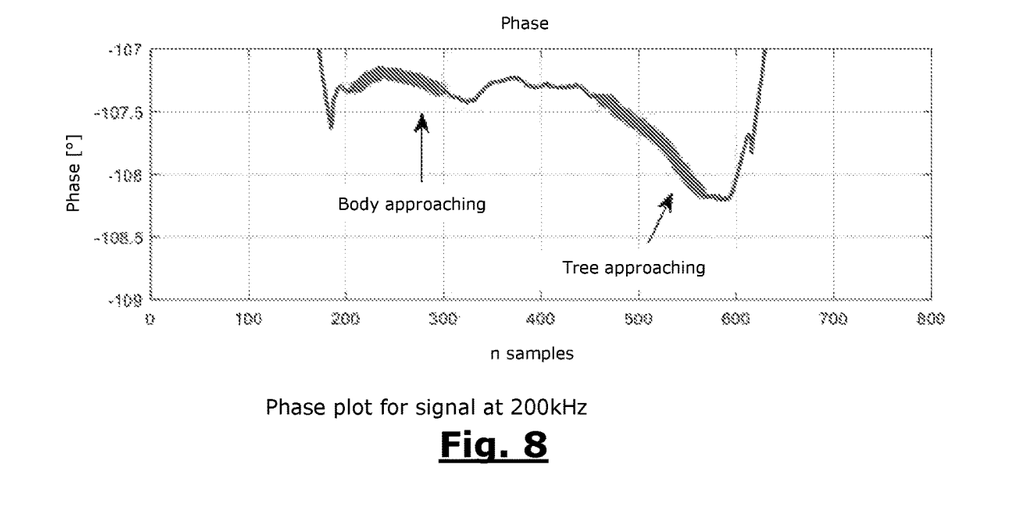

Referring to FIGS. 6-8, it can be noted instead that the phase of impedance behaves differently in the approaching to the tree and to the human body of the operator and the behaviour varies even at different frequencies.

At frequencies generally lower than 15 kHz (FIG. 6), the approaching to the body causes a impedance phase variation (with positive slope or derivative) of opposite sign with respect to the approaching to the tree (phase with negative slope or derivative).

At frequencies of the order of 100 kHz (FIG. 7), the approaching to the body does not cause phase variations, while the approaching to the tree causes variations with negative slope, consistent with the trend at low frequencies, even if the phase variation begins at greater distances from the tree and has a steeper slope.

At frequencies above 200 kHz (FIG. 8) the approaching to the body and to the tree causes similar phase variations, with a negative slope, but they are generally steeper when there is an approaching to the tree.

Taking advantage of these behaviours it is possible to provide an effective device for detecting an approaching of the cutting member to the human body, which is also able to distinguish the approaching of the cutting member to another object strongly capacitively coupled to the body of the operator.

According to the invention, therefore, a detecting apparatus is provided which is arranged to perform a measurement of the complex impedance between the two corresponding armatures, respectively, at the cutting member and at the tool handle joined to the operator, in particular by performing the measurement and then an assessment of the detected values at different signal frequencies.

In this way, a processing unit on board of the processing apparatus is able to exploit the variations of magnitude and phase of the detected electrical signal, to establish whether the cutting member is approaching a mass capacitively coupled to the operator (who grabs the tool from which the reference electrical signal is output) and whether the object is the human body or other object to be cut.

The protection system according to the invention is applied to a portable cutting tool provided with a gripping member and a movable cutting member. It comprises a pair of electrodes, one distal and one proximal, arranged respectively on the cutting member of the portable tool and on a gripping member, for example the metal handle of a chainsaw. The two electrodes are connected to a processing or measuring unit, installed on the body of the portable tool: it provides an electric output signal which is fed into the proximal electrode on the handle and detects an electric input signal from the distal electrode or detection sensor/transducer.

The processing unit, typically consisting of an integrated circuit, is configured to send a predetermined signal to the handle of the portable tool, to extract a set of quantities from the variable impedance value detected on the distal electrode on the cutting member and, based on the variable impedance value between the two electrodes, to perform mathematical operations for assessing the magnitude and phase of the signal and, finally, for sending a warning and protection triggering signal upon exceeding pre-set threshold values, for example apt to cause operation of stopping mechanism of the movable cutting part.

It is understood that the two electrodes act as ideal contacts with respect to two ideal armatures of a capacitor whose complex impedance is intended to be measured. In particular, the armature of the distal electrode comprises the surface of the metal blade of the cutting tool and the distal electrode itself, while the armature of the proximal electrode comprises the same proximal electrode, an electrically conductive handle of the gripping member of the tool and at least a surface part of the body of the operator, once the electrical signal fed into the handle by the measuring system passes through the hand of the operator.

As understandable, the blade of the cutting member is a good approximation to a flat armature of an ideal capacitor, while the significant edge effects on the non-regular surface of the human body can make the actual measurements diverge to some extent from those expected under ideal conditions, but as a whole they can be considered an acceptable approximation of a capacitor with flat and parallel armatures.

The processing unit, connected to the pair of electrodes, comprises transmission means, receiving means and processing means. The processing unit can be powered by a means of a special electric accumulator, such as a battery on board of the cutting tool, or by the voltage supply of the tool (for the main grid or deriving from a large capacity accumulator) if it is electrically powered.

The transmission means have the function of feeding towards the proximal electrode an electrical tension signal (for example with a magnitude of a few hundred mV), suitably modulated at a certain number of frequencies, preferably in such a number that their sum constitutes a pseudo-random noise (as described below). To this end, the transmission means substantially and sequentially comprise a discrete digital time signal source, a digital-analogue transduction circuit block through DAC (Digital-to-Analog Converter) converters and a set of separating amplifiers used as output buffers from the DAC. Preferably a voltage regulator is also provided downstream of the power source, to stabilize the supply voltage on the rest of the circuit, ensuring a constant voltage with an acceptable dynamic, so as to ensure an excursion between a minimum value and a maximum value wherein the signal is free from distortions. A bypass (decoupling) capability is possibly introduced between the power supply source and the regulator circuit to eliminate any interference on the main signal.

The DAC converters can be weighted resistance converters or ladder converters or other types (for example incorporated in the functions of an integrated microcontroller). The DAC converter, acting substantially as a voltage generator, feeds the voltage signal to the handle of the gripping body, possibly, the converter is followed by a buffer amplifier (voltage follower), to whose output the conductive element of the handle on which the voltage signal flows is connected.

The receiving means have the function of detecting the electrical signal of complex impedance between the two proximal and distal electrodes, when they are at a sufficiently close distance to act as armatures of a capacitor.

According to the invention, in particular, both the magnitude and the phase of the complex impedance signal are detected and assessed to determine a risk/warning condition.

These reception means substantially comprise at least one impedance measuring amplifier, an analog-to-digital transduction circuit block through ADC converters (Analog-to-Digital Converter), a conditioning circuit block for subjecting the detected signal to the adapted dynamics, circuit blocks for magnitude and phase measurements of the detected signal, operational comparators for comparing the signal with certain threshold values and operational blocks for mathematical applications.

The ADC converters used can be of the stair-step ramp or tracking or successive approximations (SAR) converter type or of another type (for example incorporated in the functions of an integrated microcontroller).

The receiving or detecting means have the function of acquiring the input signal in the system, typically at the distal electrode on the tool blade, and then providing it to the processing unit for analysis and calculations intended to determine warning conditions. In these receiving means the electrical signal can therefore be conditioned, for example to acquire only a part thereof in a suitable time window (as will be seen further below), in the most appropriate and useful way for the subsequent processing. In particular, the measurement/acquisition of the complex impedance signal occurs at multiple frequencies (between 1 kHz and 500 kHz), with pseudo-random noise techniques with synchronous detection.

Figure 2:
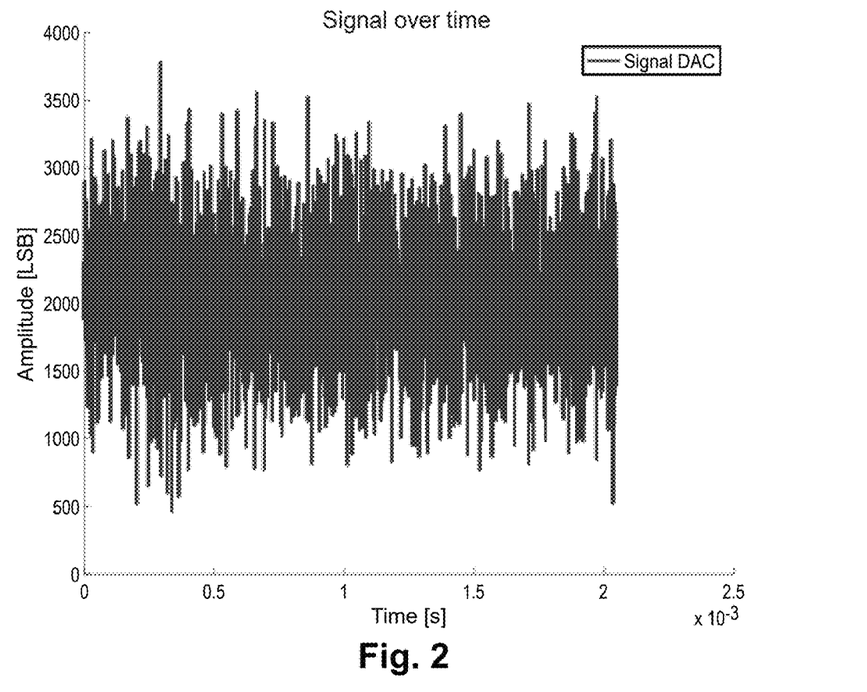
FIG. 2 is an exemplary diagram of an output signal over time, generated with pseudo-random harmonics.
Figure 3:
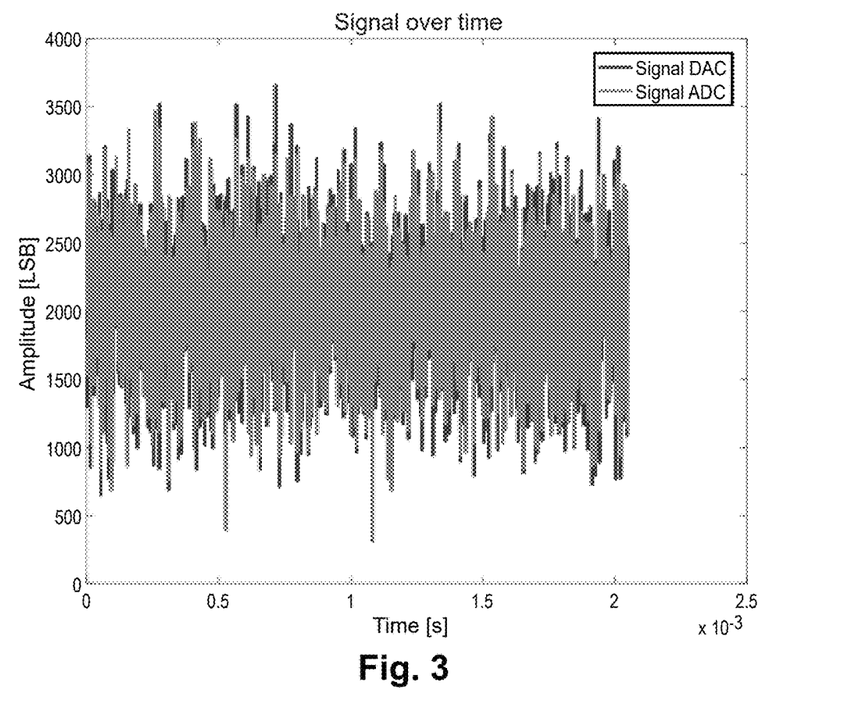
FIG. 3 is a diagram illustrating an overlapping of the signal of FIG. 2 with a corresponding sampled input signal.

In particular, according to a preferred embodiment, the emitted signal (fed into the proximal electrode) and then reacquired by the receiving means, is generated by taking advantage of a pseudo-random noise technique, i.e. generating a signal given by the sum of multiple pure sinusoids (pure tones), which provides a signal over time similar to a noise (FIG. 2), despite being a deterministic signal. This technique is preferred over that of generating only certain frequencies and then performing a frequency sweep from the acquisition side. With this technique it is in fact possible to obtain the simultaneous (synchronous) measurement of the multi-frequency response, as a comparison between the generated (and stored) signal with a certain algorithm and the signal received and decoded with the same algorithm (FIG. 3).

The processing means comprise for example a conventional microcontroller, based on a processor with suitable capacities for the computation of transduction and for processing the detected data according to the algorithm stored in a special register.

In general, all the above mentioned device can be mounted on a single PCB (Printed Circuit Board) that forms the processing unit.

Operationally, the system of the invention provides for the following operating procedure.

A signal with two or more tones (i.e. at two or more different frequencies) is fed to the handle of the portable tool, such as a chainsaw, and the received signal is measured at the electrode located on the cutting member, such as the blade of the chainsaw in the chainsaw, synchronously for each tone generated.

In a preliminary phase after switching on, when the operator grabs the tool, a first sudden positive variation (ramp) is generated in the measured impedance magnitude value—as can be seen for example with the first step of the magnitude representation plot in FIG. 5—which provides an acknowledgement of "grabbed tool", at which the processing unit preferably performs a zero setting or reset calibration of the absolute impedance values.

Subsequently, in the regime phase, the processing unit samples and measures the variation of the impedance module: when the derivative of the curve of the impedance magnitude exceeds a certain threshold, the system enters a pre-warning condition. Preferably, the generation of a first warning signal is determined by exceeding of a certain absolute magnitude value, proportionally to the evolution in time of the conductance measured between the handle and the blade, through a measure of its derivative. In this way, a variable triggering distance is obtained depending on the blade-operator approaching speed: the faster the blade approaches the operator (i.e., a high derivative of the magnitude curve), the farther (i.e., reduced threshold magnitude) the system is triggered. This mode has the great advantage of allowing an "intelligent" safety action, which is triggered only if the blade is very close to the operator, or it is still far away but is rapidly approaching.

Once the threshold on the derivative of the impedance magnitude, which generated the first warning signal, has been exceeded, the processing unit performs an analysis on the signal phase (previously sampled and stored) at least at the two different frequencies, so as to be able to establish whether the variation of the impedance magnitude is due to an actual danger situation or to a different situation, such as the contact of the cutting member with a tree.

As seen above, it has been observed that the low-frequency phase tends to rise approaching the body of the operator while it tends to drop approaching an external object (such as a tree) and instead the high frequency phase tends to drop in both cases.

Figure 9:
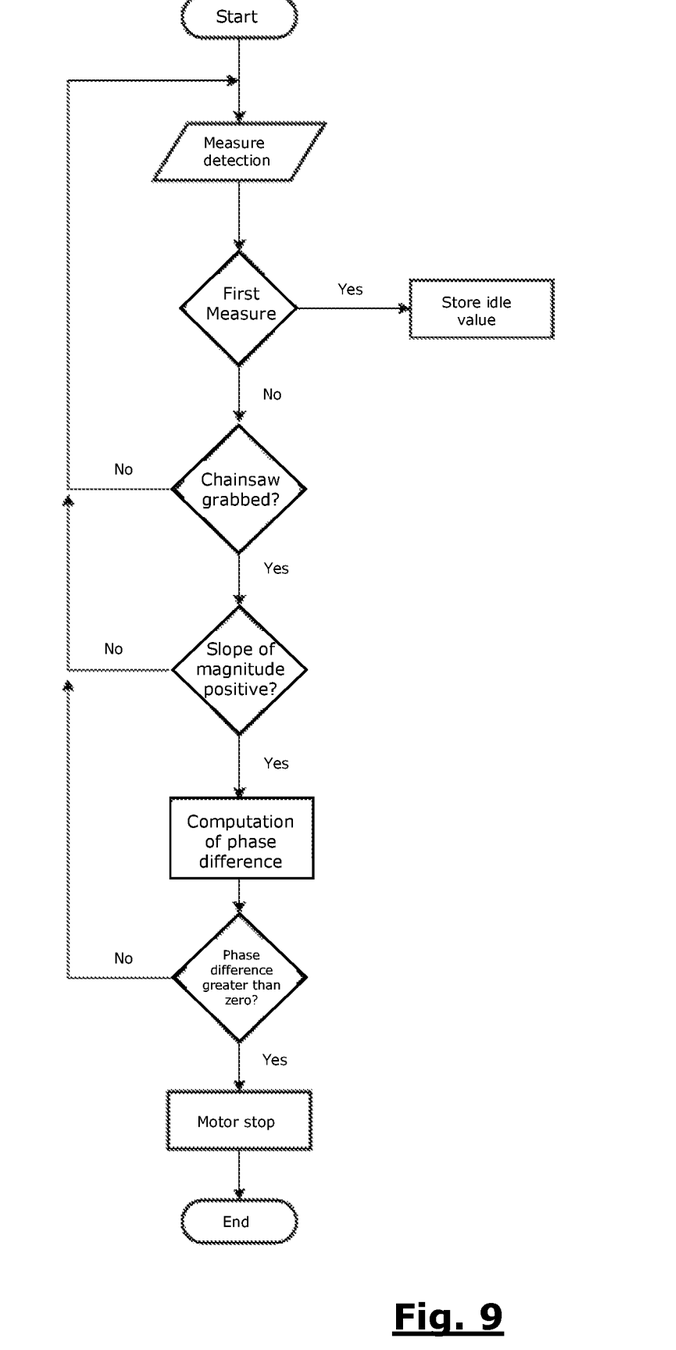
FIG. 9 represents a flow chart of a second embodiment of the driving method according to the invention.

According to a first embodiment (FIG. 9), therefore, the processing unit calculates the derivatives of the two phase signals at least at two different frequencies, one low (between 5 and 15 kHz) and the other high (around 150-200 kHz), and by means of a comparison establishes the issuance of a second additional warning signal if the derivatives of the two phase signals are opposite. The coexistence over time of the first warning signal (condition on the magnitude of the impedance) with the second additional warning signal (condition on the comparison of the impedance phases at the different frequencies) determines the generation of a stopping command which causes triggering the moving cutting member stopping means.

In the case wherein the comparison of the two derivatives indicates that the two signs are concordant, no second additional warning signal is generated and there is no triggering of the stopping means, because the first condition on the value of the magnitude is identified as a normal work situation.

It was then found that the signal at high frequencies is extremely sensitive, even from a great distance, to any event of approaching of the distal electrode (i.e. of the blade) to the mass of the object or the body of the operator: therefore the reading and analysis of the signal analysis at high frequencies are preferred to establish the initial time and the speed with which the approaching occurs and therefore to establish the generation of the first warning signal.

According to another embodiment, the processing unit performs a differential analysis between the two impedance signals, to identify whether there is a sharp divergence between the two phase values at the different frequencies: in this case, the second additional warning signal is generated.

Figure 10:
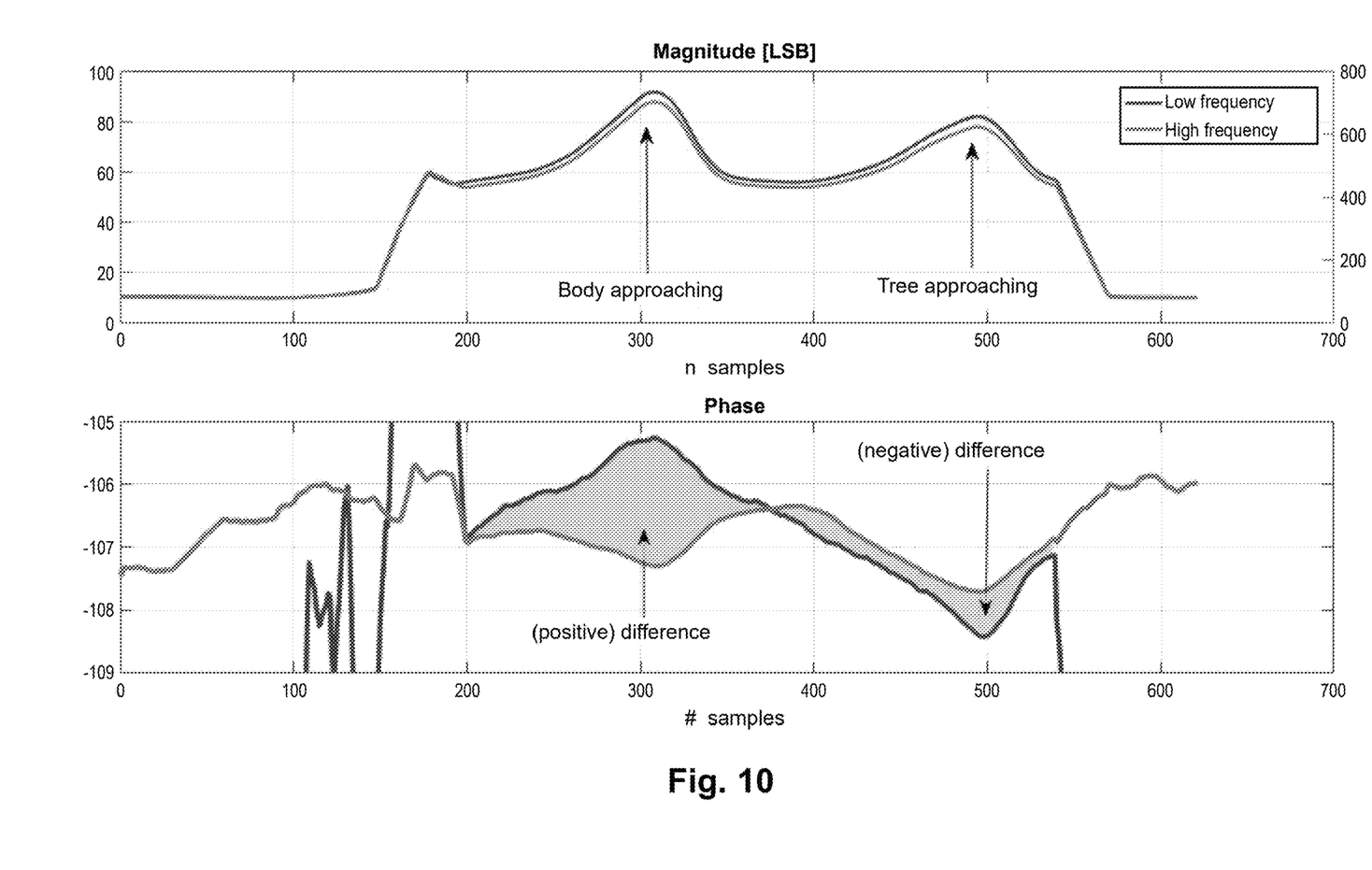
FIG. 10 is a double graphic of magnitude and phase of two signals detected during an approaching path as in FIG. 5 according to the method of FIG. 9, with signal frequency at 10 kHz (low frequency) and 200 kHz respectively (high frequency).

This condition is clearly visible from the observation of the plots in FIG. 10: overlapping the curves of the two phases it is possible to display diverging lines that diverge more and more in the case of the blade approaching the body of the operator and an almost identical but inverted trend in the case of the blade approaching a tree.

To make the divergent behaviour of the two phases more marked, the low frequency phase is preferably multiplied by a multiplicative factor. By appropriately choosing the multiplicative factor, it is possible to carry out a simple differential calculation between the phases in order to confirm or not the risk/danger situation.

Preferably, to increase the reliability of the proposed assessing method, the phase difference between the various signals is reset at the initial time of the warning situation, so that the evolution of the signal at the different frequencies is comparable in a reliable manner. For example, the moment $T_0$ is taken as the initial time of the warning situation at which the magnitude value of the high frequency signal exceeds a predetermined threshold value, for example corresponding to the magnitude value which generates the first warning signal, defined as a value higher by a certain percentage (20-30%) than the value measured at the time of calibration, i.e. when the operator grabs the portable tool.

From a practical point of view, the processing method illustrated above is performed by the microcontroller present in the processing unit.

The microcontroller generates the multi-tone signal (preferably as a pseudo-random noise) and acquires the return signal on the distal electrode of the blade, processing it with a synchronous acquisition (multiplication by sine and cosine to obtain the Fourier coefficients of the considered tones). The microcontroller measures in real time the derivative of the impedance magnitude by measuring the amplitude of the signals. As seen above, in the case wherein the derivative of the signal magnitude is greater than a predetermined threshold, the microcontroller also assesses the evolution of the phases in the signals at the various frequencies during the last acquisitions/samplings performed and stored (for example the last 3 or 5 measurement points) and decides whether to confirm the warning (generating also the second additional warning signal) and activate the stopping of the mechanical triggering system, or whether to ignore the warning, as it is not due to a proximity blade-operator.

Figure 4:
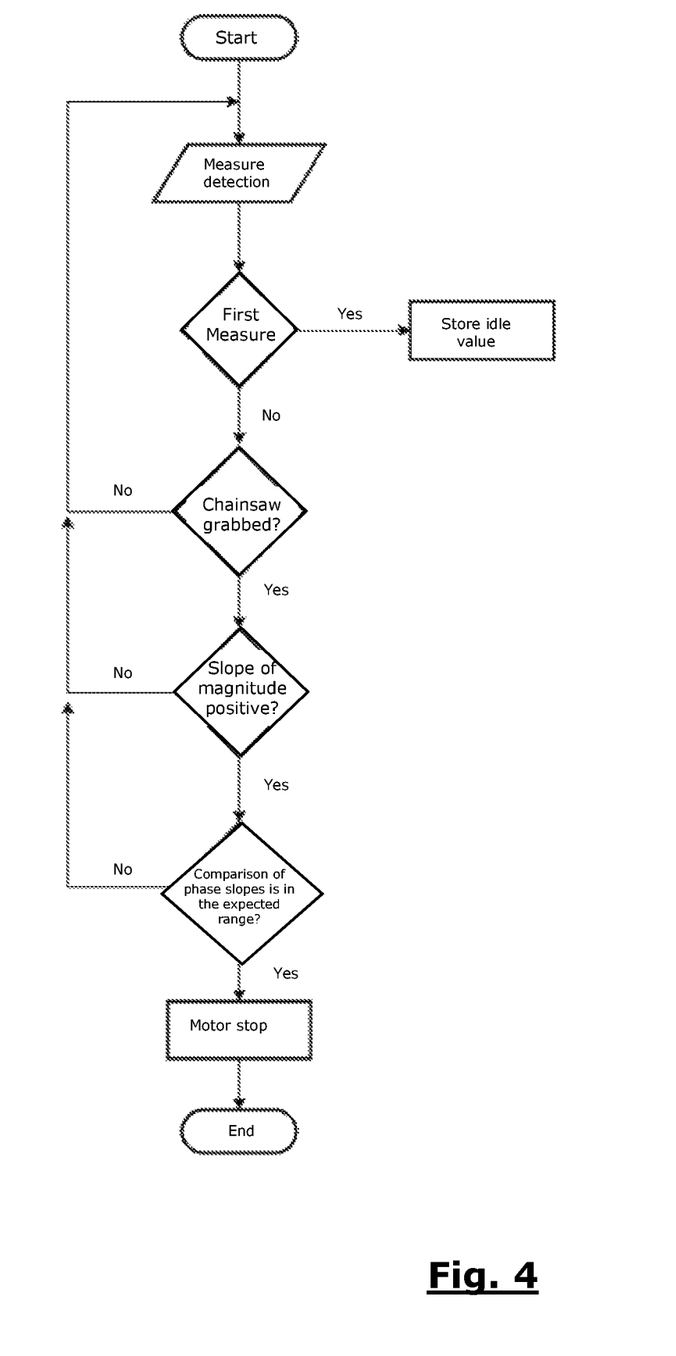
FIG. 4 represents a flow chart of a first embodiment of the operating method according to the invention.

In FIG. 4 the fundamental steps that characterize in base terms the active protection method of the invention are shown.

Upon starting the cutting tool, the operator's hand must be in the act of tightening the handle wherein the conductive element is present for contact with the circuit. In the first instants, the terminals on the blade and the handle do not have any significant impedance across them, except for the establishment of a negligible coupling through the air.

Upon powering-up, the measurement values are saved in a specific records register as "no-load" values and are used to decide whether the cutting tool has been correctly grabbed.

Since it has been noticed that, once the portable tool gripping element has been grabbed, the plot of the magnitude undergoes an increase that reaches up to 5 times its no-load value, the first operation performed by the logic of the microcontroller provides for multiplying by 4 the previously saved no-load signal value and comparing the current measurement with such constant: if the constant is exceeded, the processing unit considers the tool grabbed and the processing and control method can begin its full operation.

In the subsequent steps, the slope of the magnitude of the electrical signals is measured at the various frequencies or preferably only at the highest frequency: to minimize the computation time it is in fact possible to assess the magnitude only of the tone with a higher frequency, which is the most sensitive to capacitive variation due to the approaching of the blade.

To calculate the derivative of the signal curves, according to the first embodiment, a linear 'fitting' is preferably performed on the points acquired over time and stored. An acquisition mask is thus prepared which establishes how many points (data) of acquisition/sampling to consider useful for the computation of a straight line of the linear fitting. The more points are included in the calculation, the more the estimate of the derivative will be accurate, but considering points too far back in time, may run the risk of comprising again in the calculation points belonging to a past moving away event while maybe an approaching is occurring, thus causing an average effect which causes a slope estimate close to zero or negative, when instead the plot is rising immediately after a descent. Thus, using too many points significantly alters the slope information or signal derivative. As a compromise solution, it is preferable to configure the acquisition mask with as many points as possible but avoiding including elements that concern already concluded approaching events. Therefore, when the slope of the magnitude is reduced (i.e. the derivative becomes negative, a sign that there is a moving away event), the acquisition mask is reset regardless of the number of samples set and only from that point onwards the number of samples in the mask is increased until reaching a pre-selected maximum value (for example 5 points).

In addition to determining the mask, the computation of the fitting requires selecting the method with which the approximation line with respect to the acquisition points is to be found: according to a preferred embodiment, the approximation line is calculated with the least squares method.

Once the approximation lines of the sampling points have been identified and therefore the slopes of the high and low frequency signals, the method establishes whether to activate the motor stop (i.e. the stopping mechanism of the moving cutting member) when the low frequency phase has positive slope and the high frequency phase is negative (discordant signs).

FIG. 10 represents a simplified flow chart of the method according to the second embodiment with differential calculation. In this case, in addition to the first steps similar to those of the first embodiment, carrying out a last comparison step is provided, wherein it is assessed whether the phase difference between the signals at the different frequencies is greater than zero.

In summary, a simplified methodology of operation can provide for continuously sampling the signal impedance magnitude at a selected frequency and the phase difference of the signal at two different frequencies at points spaced over time: when the signal magnitude increases beyond a predetermined threshold and the phase difference between two successive points over time has a positive trend, then the processing unit generates the stopping signal.

Optionally, in this case it is provided that, after the initial detection of the handle of the portable tool, the signal phases at the different frequencies are subtracted and the low-frequency signal is translated by the just calculated value. In doing so the two or more phases of the corresponding signals restart from the same point and from then on, any positive difference between the two will indicate a danger event.

A summary assessment of the necessary reaction times of the system and the performance of the components currently available has shown that it is possible to complete the computation and assessment of danger, as well as the stopping of the moving parts of a chainsaw, at times suitable for safety (typically less than 100 ms) with a system cost fully compatible with industrial production.

As can be well understood from the above description, the devised system allows to fully achieve the purposes stated.

The active protection system, by means of the method described, allows the use of derivative and differential techniques on signals acquired at different frequencies, discriminating with considerable reliability the approaching of a blade of the cutting tool to the body of an operator with respect to another object coupled with it.

It should also be noted that the derivative measurement of the impedance magnitude allows to obtain a triggering distance of the stopping mechanism that is variable based on the speed of approaching of the blade, so it allows to work also with the blade close to the body (for example a tree held from the foot of the operator, but at a constant distance from the blade), as well as to quickly intervene if the blade undergoes a kickback towards the operator which causes a sudden acceleration of approaching.

Furthermore, the impedance measurement allows to determine the time at which the operator has grabbed the chainsaw, thus starting a self-calibration procedure useful to consider the surrounding conditions (for example the use of gloves, because the triggering threshold can be parameterized on the initial measured impedance value, which increases when gloves are used).

It is understood, however, that the invention is not to be considered as limited by the particular arrangements illustrated above, which represent only exemplary embodiments of the same, but different variants are possible, all within the reach of a person skilled in the art, without departing from the scope of the invention itself, which is exclusively defined by the following claims.

It is to be considered, for example, that the reliability of the method described is independent of the performance and type of devices chosen. It is therefore not ruled out that different electronic devices and alternative circuit configurations may be used, but always equivalent in operation in order to achieve the aims provided by this active protection method.

The active protection system can additionally provide for other triggering criteria of the mechanical brake/stop on the moving cutting member, for example the detection of a hand detachment from the tool handle, performed with the analysis of the impedance signal (when the value of the magnitude falls below the calibration threshold) or by detection with a classic current switch arranged on the handle.

The system is applicable not only to machines for pruning, cutting and felling trees, such as a chainsaw, but also to other cutting tools, such as electric knives used in the food industry or similar.

The invention claimed is:

1. An active protection system in a portable cutting tool, with movable cutting members, comprising at least:
   stopping means of said movable cutting members,
   a control and processing unit that triggers said stopping means upon the detection of a danger condition,
   a proximal electrode electrically coupled with a handle of said portable cutting tool and a distal electrode electrically coupled with said movable cutting member, to make up an armature of a capacitor, said control and processing unit feeding an electric output signal into one of said proximal electrode and said distal electrode and detecting an electric input signal on another one of said proximal electrode and said distal electrode, wherein said electric output signal comprises at least two different frequencies, a detection unit is also provided which detects a complex impedance of said electric input signal at said at least two different frequencies, and said control and processing unit determines the danger condition and causes triggering of said stopping means based on a value of a magnitude of said complex impedance of said electric input signal and on a phase difference of said complex impedance of said electric input signal at said at least two different frequencies.

2. The active protection system as in claim 1, wherein said danger condition is determined when said magnitude of the complex impedance of said electric input signal exceeds a pre-set threshold and the phase difference between first and second signals at said at least two different frequencies is increasing in at least two successive points in time.

3. The active protection system as in claim 2, wherein said electric output signal is filed on said proximal electrode.

4. The active protection system as in claim 2, wherein said electric output signal generated at said at least two different frequencies is generated with pseudo-random noise techniques.

5. The active protection system as in claim 2, wherein said at least two different frequencies are at least a low frequency between 5 and 15 kHz and a high frequency at about 150-200 kHz.

6. The active protection system as in claim 1, wherein said electric output signal is filed on said proximal electrode.

7. The active protection system as in claim 6, wherein said electric output signal generated at said at least two different frequencies is generated with pseudo-random noise techniques.

8. The active protection system as in claim 6, wherein said at least two different frequencies are at least a low frequency between 5 and 15 kHz and a high frequency at about 150-200 kHz.

9. The active protection system as in claim 1, wherein said electric output signal generated at said at least two different frequencies is generated with pseudo-random noise techniques.

10. The active protection system as in claim 9, wherein said at least two different frequencies are at least a low frequency between 5 and 15 kHz and a high frequency at about 150-200 kHz.

11. The active protection system as in claim 1, wherein said at least two different frequencies are at least a low frequency between 5 and 15 kHz and a high frequency at about 150-200 kHz.

12. An active protection method in a portable cutting tool with movable cutting members, comprising at least:

stopping means of said movable cutting members, a control and processing unit that triggers said stopping means upon the detection of a danger condition, a pair of electrodes arranged on a handle of said portable cutting tool and on said movable cutting member, respectively, to make up an armature of a capacitor, wherein there are provided the steps of feeding an electric output signal into one of said pair of electrodes, detecting an electric input signal on another of said pair of electrodes, assessing said danger condition based on said electric input signal, wherein said electric output signal is filed at least at two different frequencies, a complex impedance of said electric input signal is detected at said at least two different frequencies, and said danger condition is determined by the control and processing unit based on a value of a magnitude of said complex impedance at least at a chosen frequency and on a phase difference of said complex impedance at said at least two different frequencies.

13. The active protection method as in claim 12, wherein said danger condition is determined when said magnitude valve of the complex impedance exceeds a pre-set threshold and the phase difference between the first and second signals at said at least two different frequencies is increasing in at least two successive points in time.

14. The active protection method as in claim 13, wherein a reset of said fed electric signal is carried out at the time when a first ramp is detected in said magnitude of the complex impedance of said electric input signal.

15. The active protection method as in claim 13, wherein said danger condition is assessed by determining a derivative of the complex impedance of said electric input signal within a time acquisition slot of said electric input signal, said slot being restored whenever the slope of said magnitude of the complex impedance of said electric input signal is reduced.

16. The active protection method as in claim 13, wherein said at least two different frequencies are at least a low frequency between 5 and 15 kHz and a high frequency at about 150-200 kHz.

17. The active protection method as in claim 12, wherein a reset of said fed electric signal is carried out at the time when a first ramp is detected in said magnitude of the complex impedance of said electric input signal.

18. The active protection method as in claim 17, wherein said danger condition is assessed by determining a derivative of the complex impedance of said electric input signal within a time acquisition slot of said electric input signal, said slot being restored whenever the slope of said magnitude of the complex impedance of said electric input signal is reduced.

19. The active protection method as in claim 12, wherein said danger condition is assessed by determining derivative of the complex impedance of said electric input signal within a time acquisition slot of said electric input signal, said slot being restored whenever the slope of said magnitude of the complex impedance of said electric input signal is reduced.

20. The active protection method as in claim 12, wherein said at least two different frequencies are at least a low frequency between 5 and 15 kHz and a high frequency at about 150-200 kHz.

* * * * *